United States Patent
Raveendran et al.

(10) Patent No.: US 7,268,708 B2
(45) Date of Patent: Sep. 11, 2007

(54) METHOD AND APPARATUS FOR IMPROVED MULTIMEDIA DECODER

(75) Inventors: Vijayalakshmi R. Raveendran, San Diego, CA (US); Peisong Chen, San Diego, CA (US); Tao Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/434,827

(22) Filed: May 15, 2006

(65) Prior Publication Data

US 2006/0267807 A1    Nov. 30, 2006

Related U.S. Application Data

(60) Provisional application No. 60/681,194, filed on May 13, 2005, provisional application No. 60/789,455, filed on Apr. 4, 2006.

(51) Int. Cl.
*H03M 7/40* (2006.01)
(52) U.S. Cl. .............................. 341/67; 341/60; 710/52
(58) Field of Classification Search .................. 341/60, 341/65, 67; 710/52–57
See application file for complete search history.

(56) References Cited

U.S. PATENT DOCUMENTS

| | | | | |
|---|---|---|---|---|
| 5,173,695 A | * | 12/1992 | Sun et al. | 341/67 |
| 5,226,082 A | * | 7/1993 | Kustka | 380/46 |
| 5,614,900 A | * | 3/1997 | Watanabe | 341/67 |
| 5,644,306 A | * | 7/1997 | Brent | 341/67 |
| 5,675,331 A | * | 10/1997 | Watanabe et al. | 341/67 |
| 6,014,095 A | * | 1/2000 | Yokoyama | 341/67 |
| 6,285,789 B1 | * | 9/2001 | Kim | 382/233 |

\* cited by examiner

*Primary Examiner*—Howard Williams
(74) *Attorney, Agent, or Firm*—Thomas Rouse; Timothy F. Loomis; Timothy E. Buckley

(57) ABSTRACT

Embodiments include systems and methods of improving processing in a decoder in a multimedia transmission system. Multimedia data may include one or more of motion video, audio, still images, or any other suitable type of audio-visual data. One embodiment includes a system and method of parsing fixed and variable length codes from a bit-wise stream of multi-media data by maintaining and reading the data in a processor aligned (e.g., word aligned) way. Another embodiment includes a system and method of decoding variable length codes, particular as received from such a variable length code using multiple levels of decoding tables to speed up decoder table lookup.

33 Claims, 14 Drawing Sheets

METHOD AND APPARATUS FOR IMPROVED MULTIMEDIA DECODER

CLAIM OF PRIORITY UNDER 35 U.S.C. §119

This application claims the benefit of, and incorporates by reference in their entirety, U.S. Provisional Application No. 60/681,194, filed May 13, 2005 and U.S. Provisional Application No. 60/789,455 entitled "VIDEO DECODER OPTIMIZATIONS," filed on Apr. 4, 2006.

BACKGROUND OF THE INVENTION

1. Field of the Invention

The invention relates to digital communications and, more particularly, to channel and source decoding.

2. Description of the Related Technology

Networked multimedia applications tend to need higher bandwidth, better coding and compression schemes, or both. However, for mobile communications factors such as limited transmit power, limited bandwidth and multi-path fading tend to restrict the data rates provided by available systems. Various encoding schemes have been used to minimize errors while maintaining a desirable data rate, however all of these techniques suffer from problems with errors arriving at the decoder side.

Through the use of a source encoder, data is compressed. Typically, a channel encoder then encodes the compressed source data to maximize the capacity of the transmission channel for a given error rate.

Source coding techniques such as reversible variable length coding (e.g. in MPEG-4) have been used for error recovery by decoding the packet in the reverse order if corrupt packets are in fact received. One type of source coding includes entropy coding. Entropy coding enables efficient lossless representations of symbols generated by information sources. However, although entropy coding may improve compression efficiency, entropy coding also complicates the decoding process. Entropy coders assign a variable length binary data pattern, a codeword, to a one or more source symbols. To improve compression rates, the length of the binary pattern associated with a source symbol increases with decreasing symbol likelihood. Symbols that occur in the source stream with higher frequency are assigned more compact representations. This can enable, on average, a substantial savings over a straightforward symbol alphabet having a fixed-length representation.

However, if transmitted over a channel that is comprised of a stream of bits, variable length codes tend to increase the complexity of the decoder. For example, the ambiguity around how many bits to consume from the bitstream of the channel for the next symbol is addressed by identifying the start and end of each codeword.

Accordingly, improved systems and methods of decoding variable length codes are needed in order to further increase data rates for a given amount of processing power. For example, improved performance of variable length decoders is needed to enable higher data rate multi-media to be decoded by mobile or other low power devices.

SUMMARY OF CERTAIN INVENTIVE ASPECTS

The system, method, and devices disclosed herein each have several aspects, no single one of which is solely responsible for its desirable attributes. Without limiting the scope of this invention as expressed by the claims which follow, its more prominent features will now be discussed briefly. After considering this discussion, and particularly after reading the section entitled "Detailed Description of Certain Embodiments" one will understand how the features of this system and method provide advantages that include more efficient decoding of multi-media data.

One aspect includes a method of processing received encoded multimedia data. The method includes determining a number of bits available in a first buffer of encoded multimedia data from a received bitstream. The method further includes, if reading a fixed length codeword, reading processor-aligned data from the bitstream into the first buffer. The fixed length codeword comprises the determined available bits and bits associated with a portion of the processor-aligned data. The method further includes, if reading a variable length codeword, reading processor-unaligned data from the bitstream into the first buffer. The variable length codeword comprises at least some of the available bits.

One aspect includes a computer readable medium for embodying a method for processing multimedia data. The method includes determining a number of bits available in a first buffer of encoded multimedia data from a received bitstream. The method further includes, if reading a fixed length codeword, reading processor-aligned data from the bitstream into the first buffer. The fixed length codeword comprises the determined available bits and bits associated with a portion of the processor-aligned data. The method further includes, if reading a variable length codeword, reading processor-unaligned data from the bitstream into the first buffer. The variable length codeword comprises at least some of the available bits.

One aspect includes an apparatus for processing received encoded multimedia data. The apparatus includes a means for determining a number of bits available in a first buffer of encoded multimedia data from a received bitstream. The apparatus further includes means for reading a codeword. If reading a fixed length codeword, the means for reading reads processor-aligned data from the bitstream into the first buffer. The fixed codeword comprises the determined available bits and bits associated with a portion of the processor-aligned data. If reading a variable length codeword, the means for reading reads processor-unaligned data from the bitstream into the first buffer. The variable length codeword comprises at least some of the available bits.

One aspect includes an apparatus for processing multimedia data. The apparatus includes a determiner configured to determine a number of bits available in a first buffer of encoded multimedia data from a received bitstream. The apparatus further comprises a reader configured to, if reading a fixed length codeword, read processor-aligned data from the bitstream into the first buffer. The fixed length codeword comprises the determined available bits and bits associated with a portion of the processor-aligned data. The reader is further configured to, if reading a variable length codeword, read processor-unaligned data from the bitstream into the first buffer. The variable length codeword comprises at least some of the available bits.

One aspect includes a processor for processing multimedia data. The processor is configured to determine a number of bits available in a first buffer of encoded multimedia data from a received bitstream. The processor is further configured to, if reading a fixed length codeword, read processor-aligned data from the bitstream into the first buffer. The fixed length codeword comprises the determined available bits and bits associated with a portion of the processor-aligned data. The processor is further configured to, if reading a variable length codeword, read processor-unaligned data from the bitstream into the first buffer. The variable length codeword comprises at least some of the available bits.

One aspect includes a method of decoding a variable length code in a stream of multimedia data. The method includes reading a first number of bits in a portion of the stream of multimedia data. The method further includes identifying first decoding data in a first data structure based at least in part on the first number of bits. The method further includes determining whether the first decoding data is indicative of a second data structure comprising decoding data. The method further includes decoding multimedia data based at least in part on one of the first and second decoding data.

One aspect includes an apparatus for decoding a variable length code in a stream of multimedia data. The apparatus includes means for reading a first number of bits in a portion of the stream of multimedia data. The apparatus further comprises means for identifying first decoding data in a first data structure based at least in part on the first number of bits. The apparatus further comprises means for determining whether the first decoding data is indicative of a second data structure comprising decoding data. The apparatus further comprises means for decoding multimedia data based at least in part on one of the first and second decoding data.

One aspect includes a computer readable medium for embodying a method for processing multimedia data. The method includes reading a first number of bits in a portion of the stream of multimedia data. The method further includes identifying first decoding data in a first data structure based at least in part on the first number of bits. The method further includes determining whether the first decoding data is indicative of a second data structure comprising decoding data. The method further includes decoding multimedia data based at least in part on one of the first and second decoding data.

One aspect includes an apparatus for processing multimedia data. The apparatus includes a reader configured to read a first number of bits in a portion of the stream of multimedia data. The apparatus further comprises an identifier configured to identify first decoding data in a first data structure based at least in part on the first number of bits. The apparatus further comprises a determiner configured to determine whether the first decoding data is indicative of a second data structure comprising decoding data. The apparatus further comprises a decoder configured to decode multimedia data based at least in part on one of the first and second decoding data.

One aspect includes a processor for processing multimedia data. The processor is configured to read a first number of bits in a portion of the stream of multimedia data. The processor is further configured to identify first decoding data in a first data structure based at least in part on the first number of bits. The processor is further configured to determine whether the first decoding data is indicative of a second data structure comprising decoding data. The processor is further configured to decode multimedia data based at least in part on one of the first and second decoding data.

DETAILED DESCRIPTION OF CERTAIN EMBODIMENTS

The following detailed description is directed to certain specific examples of the disclosed systems and methods. However, the systems and methods can be embodied in a multitude of different ways as defined and covered by the claims. In this description, reference is made to the drawings wherein like parts are designated with like numerals throughout.

Certain aspects include improvements to a decoder in a multimedia transmission system. Multimedia data may include one or more of motion video, audio, still images, or any other suitable type of audio-visual data. One aspect comprises a method of parsing fixed and variable length codes from a bit-wise stream of multimedia data by maintaining and reading the data in a processor-aligned (e.g., word aligned) way. Another aspect comprises a method of decoding variable length codes, particularly as received from such a variable length code using multiple levels of decoding tables to speed up decoder table lookup.

Figure 1:
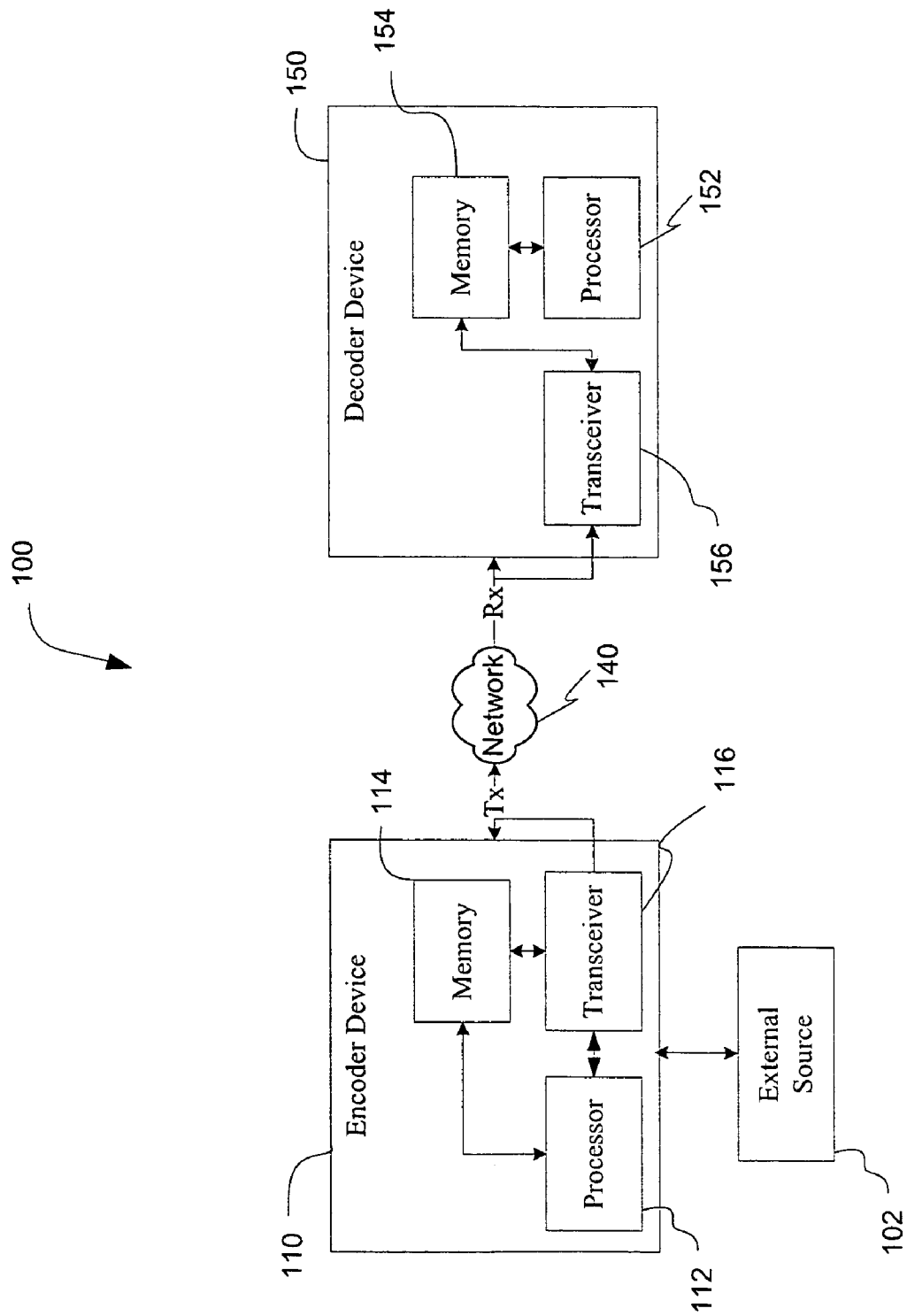
FIG. 1 is a schematic block diagram illustrating a multimedia communications system according to one aspect.

FIG. 1 is a schematic block diagram illustrating a multimedia communications system 100 according to one aspect. The system 100 includes an encoder device 110 in communication with a decoder device 150 via a network 140. In one example, the encoder device receives a multimedia signal from an external source 102 and encodes that signal for transmission on the network 140.

In this example, the encoder device 110 comprises a processor 112 coupled to a memory 114 and a transceiver 116. The processor 112 encodes data from the multimedia data source and provides it to the transceiver 116 for communication over the network 140.

In this example, the decoder device 150 comprises a processor 152 coupled to a memory 154 and a transceiver 156. The processor 152 may include one or more of a general purpose processor or a digital signal processor. The memory 154 may include one or more of solid state or disk based storage. The transceiver 156 is configured to receive multimedia data over the network 140 and provide it to the processor 152 for decoding. In one example, the transceiver 156 includes a wireless transceiver.

Figure 2:
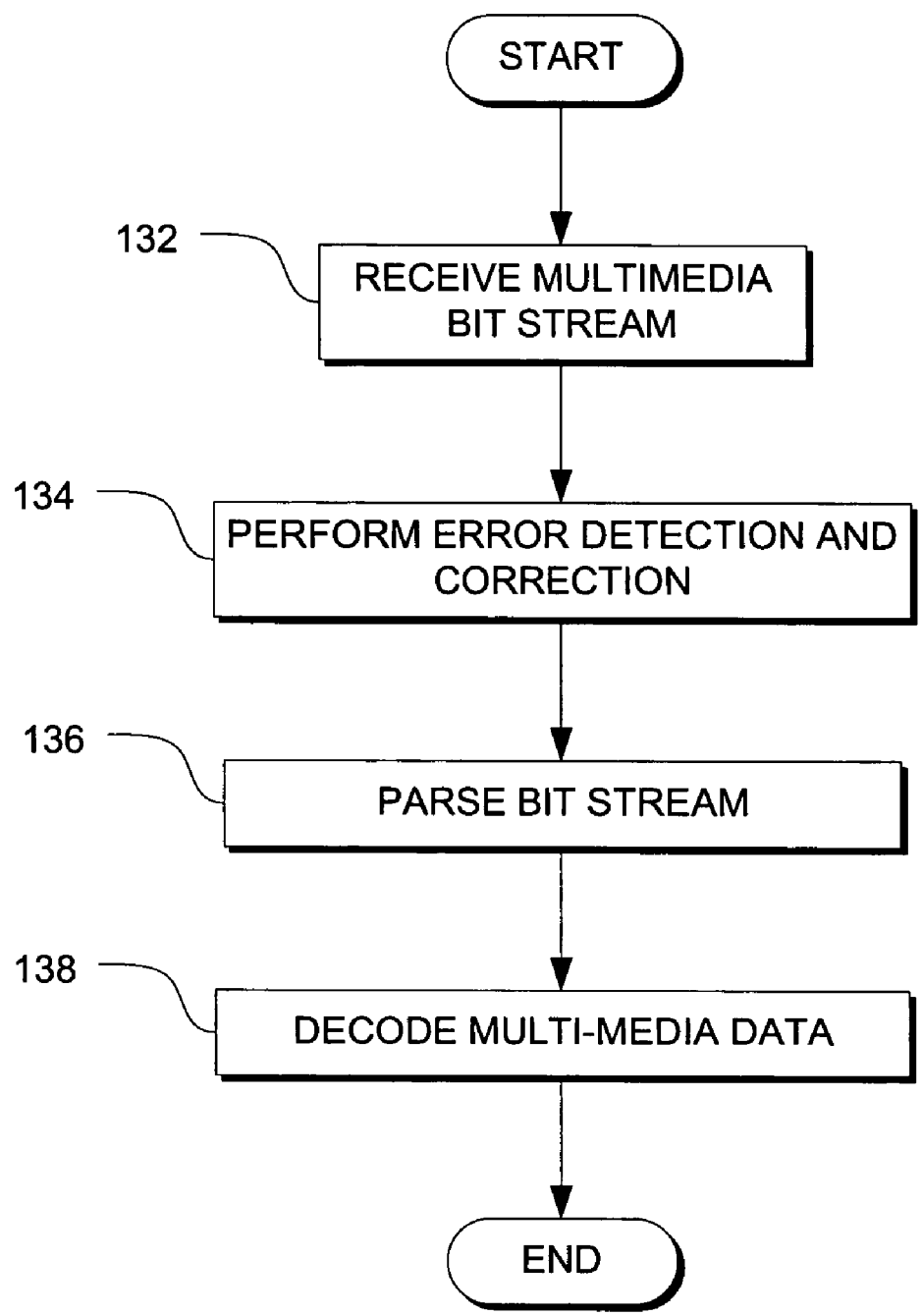
FIG. 2 is a flow chart illustrating one example of a method of decoding a bitstream of encoded multimedia data, such as that transmitted and received in the system illustrated in FIG. 1.

FIG. 2 is a flow chart illustrating one example of a method of decoding a bitstream of encoded multimedia data, such as that transmitted and received in the system 100. In one example, the bitstream of data comprises one or more of video and audio data. The bitstream can be encoded in a format such as a standard video codec specified by the Moving Pictures Expert Group (MPEG), e.g., MPEG-2, or MPEG-4. The bitstream can also be encoded in the H.264 video coding standard or any other video coding standard.

The method begins at a block 132 in which an encoded multimedia bitstream (e.g., a stream of multimedia data received as a sequence of bits of data) is received by the transceiver 156. In one example, the transceiver 156 stores the stream into the memory 154 as bytes or words of data, e.g., in one or more sequence in memory. Next at a block 134, the processor 152 performs error detection and correction. It should be noted that the received data can be processed without first being stored in the memory 154.

Figure 4B:
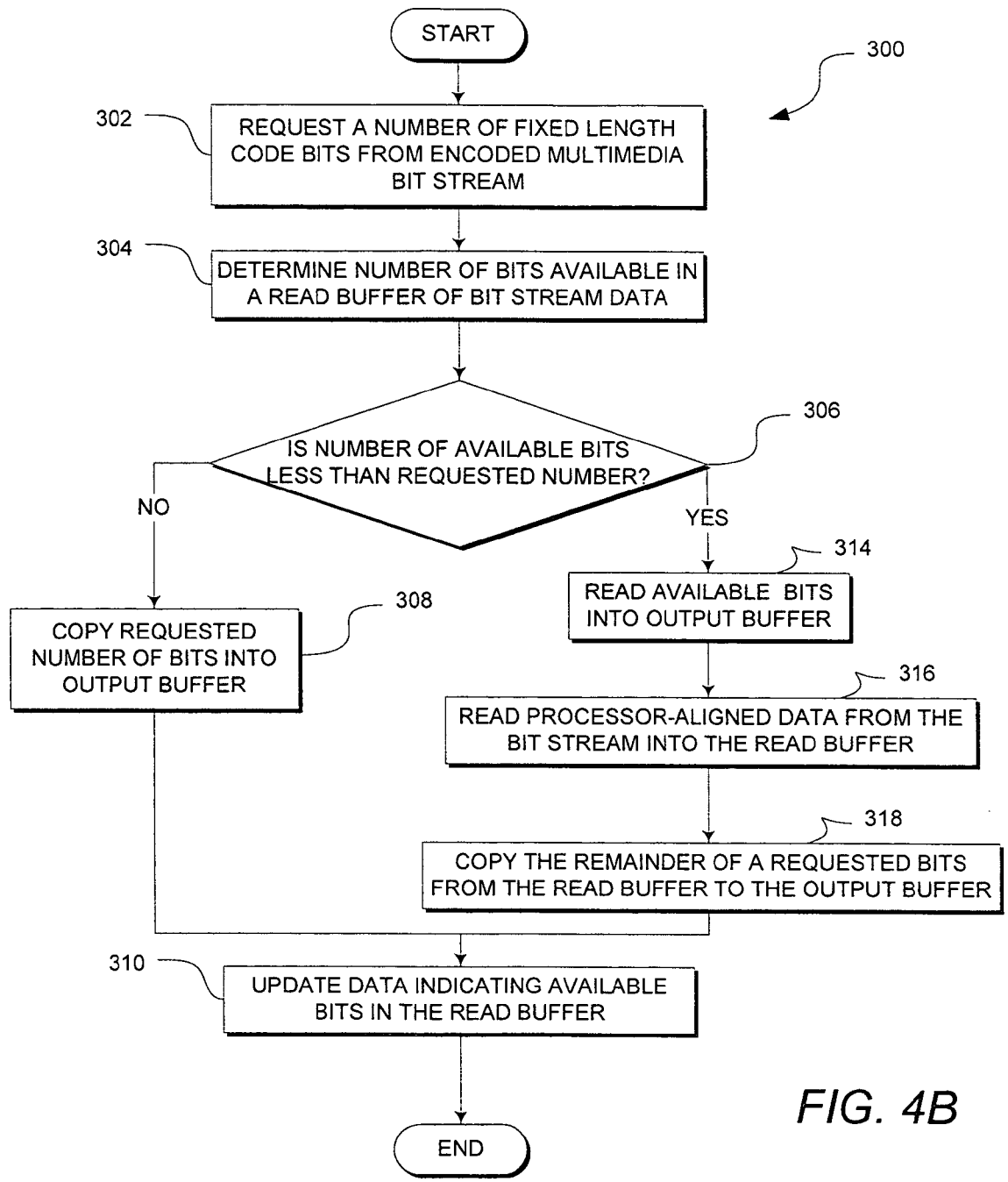
FIG. 4B is a flow chart illustrating one example of a portion of the method of processing a bitstream via buffers graphically illustrated in FIGS. 3A and 3B.
Figure 4C:
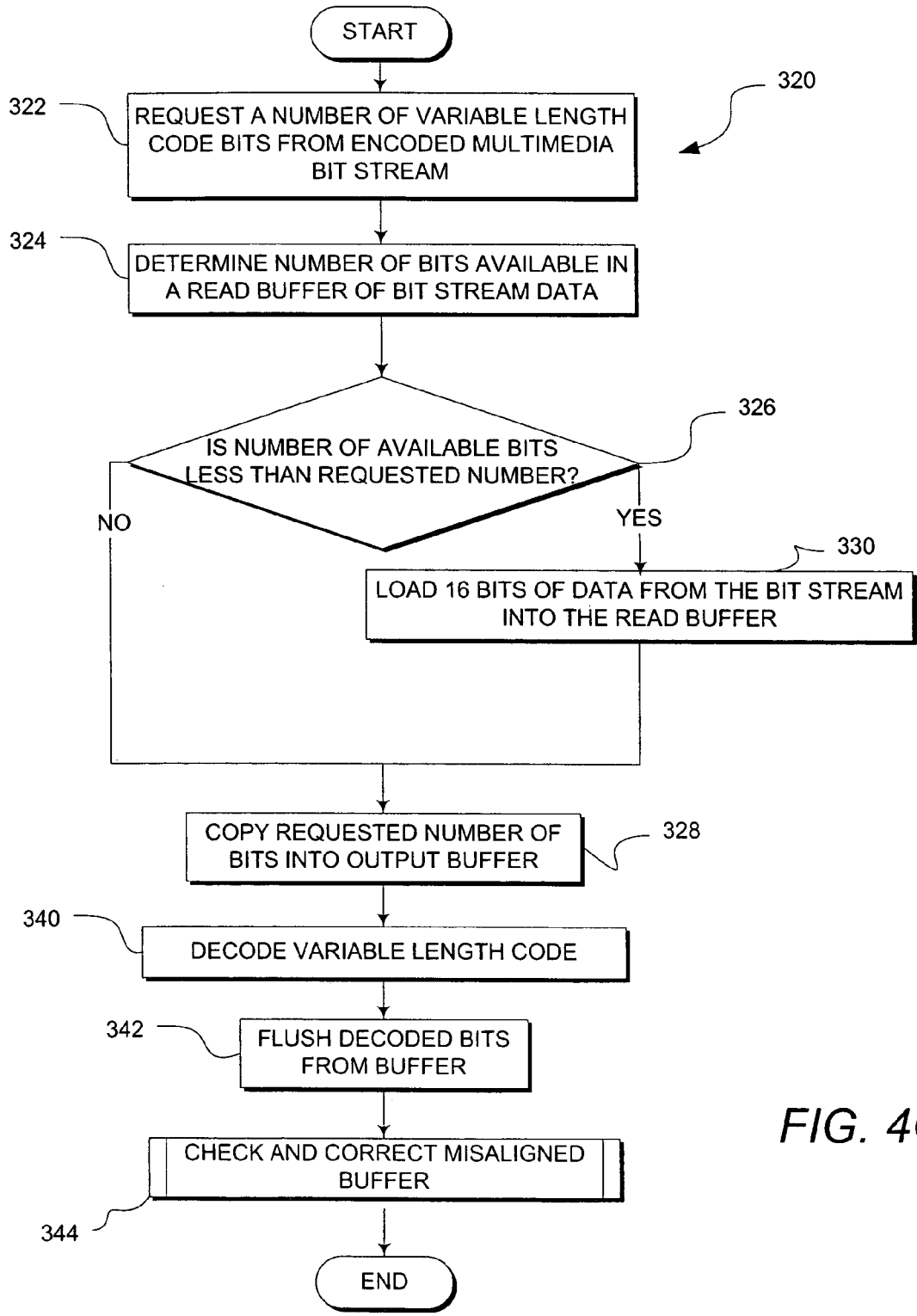
FIG. 4C is a flow chart further illustrating one example of a portion of the method of processing a bitstream, partially illustrated in FIG. 4B, for processing a variable length codeword.
Figure 4D:
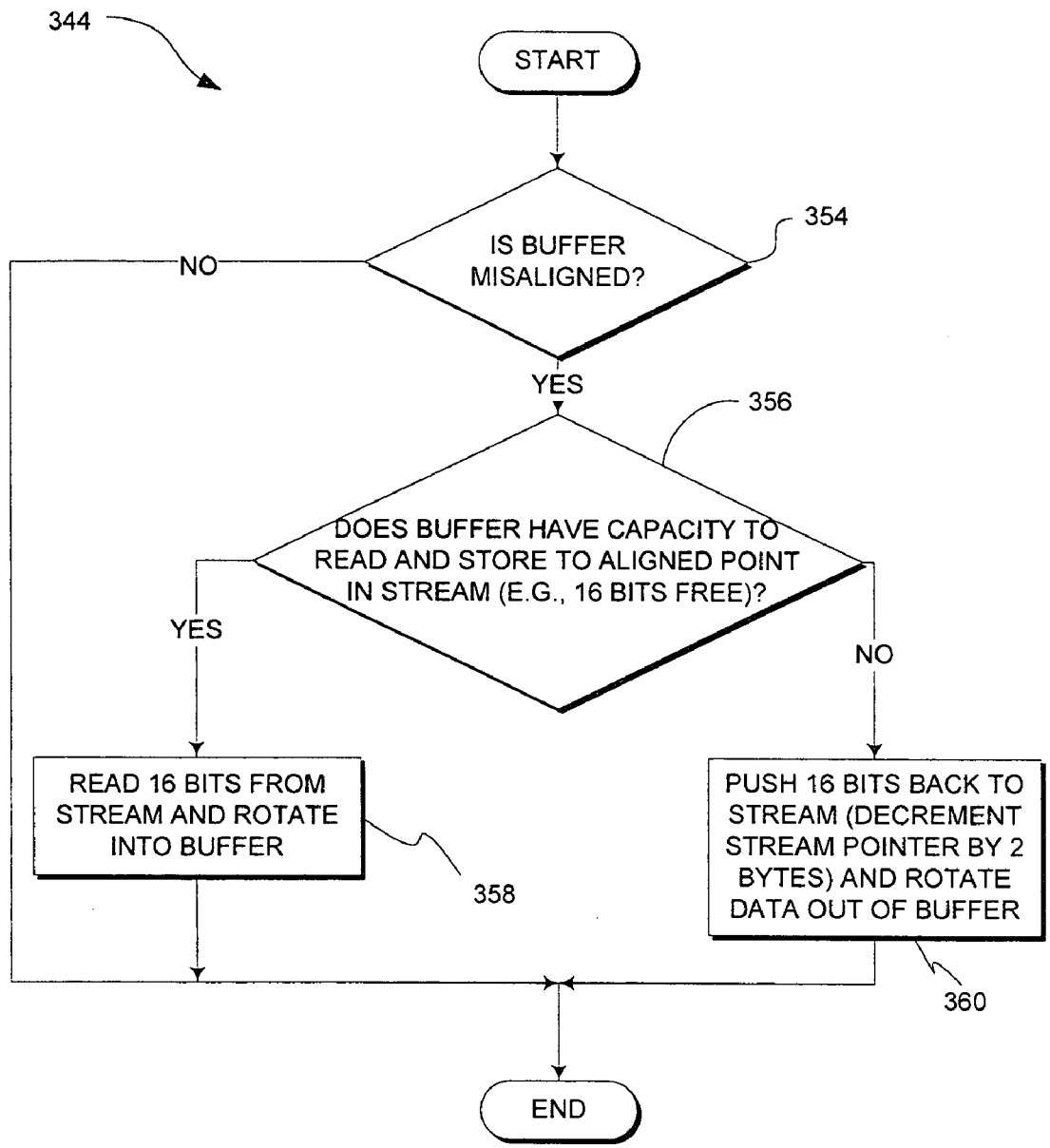
FIG. 4D is a flow chart further illustrating a portion of the method illustrated in FIG. 4C in further detail.
Figure 5:
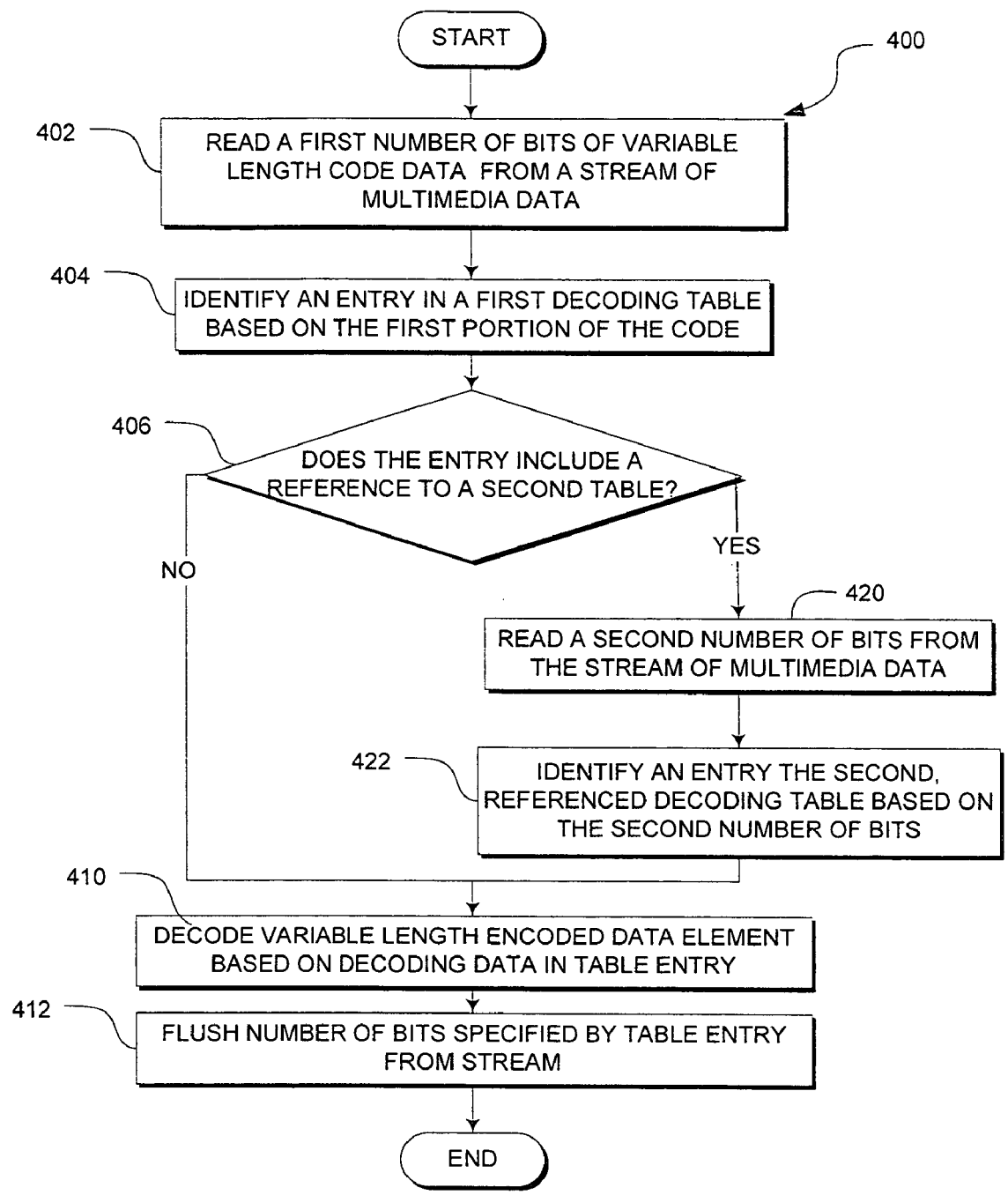
FIG. 5 is a flow chart illustrating one aspect of a method of processing multimedia data elements encoded in a variable length code from a bitstream of encoded multimedia data, such as that transmitted and received in the system illustrated in FIG. 1.
Figure 6:
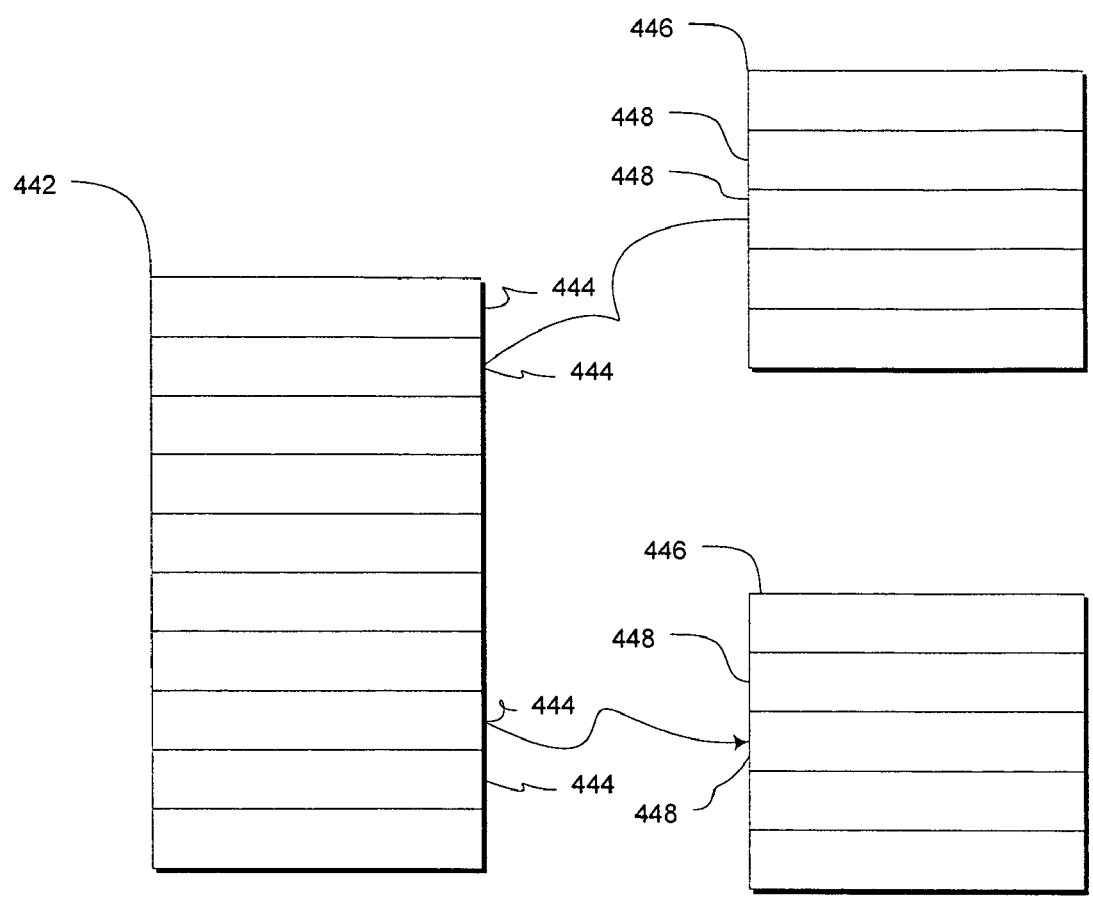
FIG. 6 is a schematic block diagram illustrating one example of a data structure such as used in the method illustrated in FIG. 5.
Figure 7:
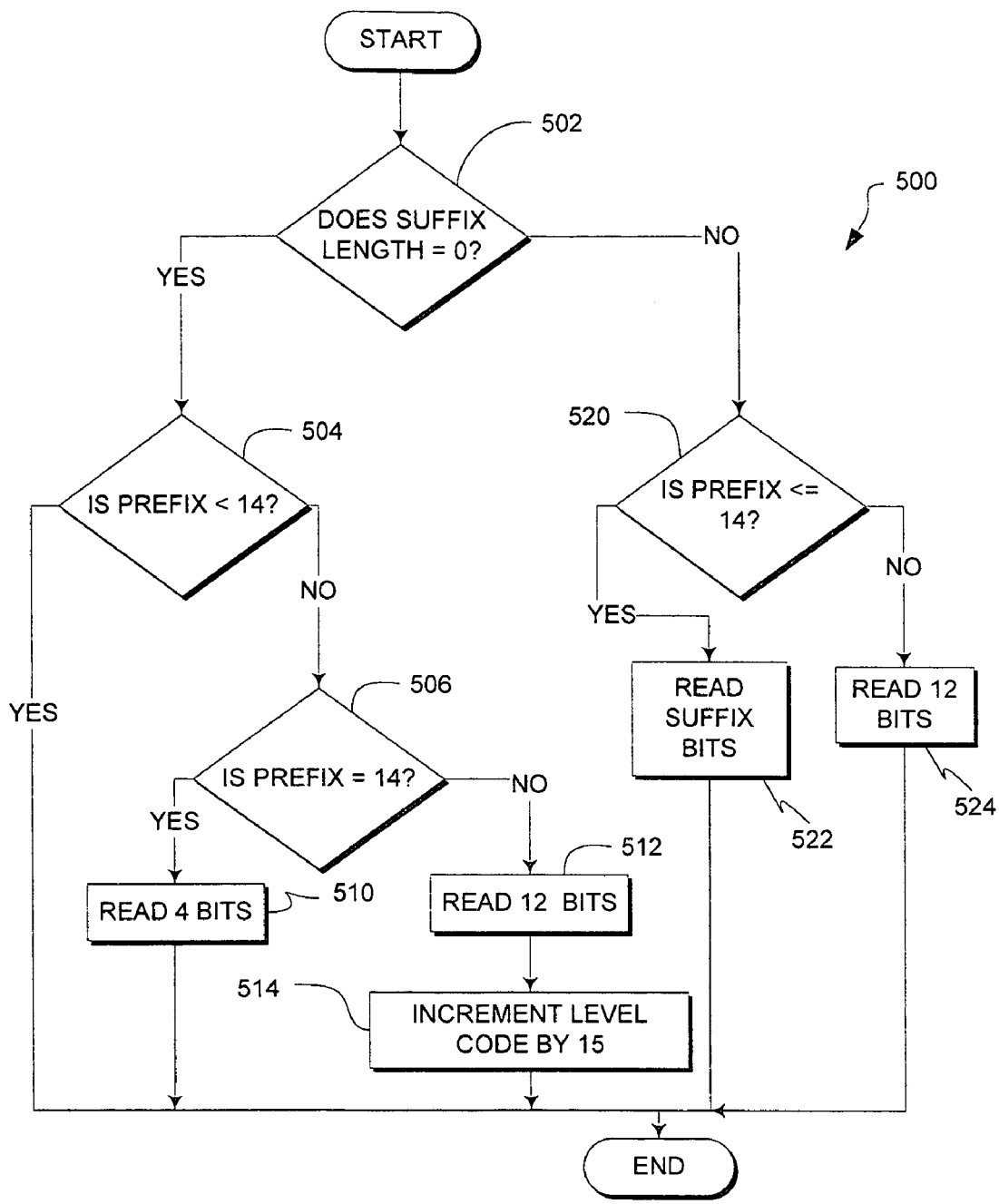
FIG. 7 is a flow chart illustrating one aspect of an improved method of processing variable length codes from a bitstream of encoded multimedia data, such as that transmitted and received in the system illustrated in FIG. 1.

Moving to a block 136, the processor 136 parses the bitstream to identify and decode data elements. FIGS. 4B-4D illustrate parsing of variable length and fixed length codewords from a datastream according to one example. In this example, parsing variable length codewords comprises decoding those codewords. FIGS. 5-7 illustrate methods of parsing and decoding variable length codes according to one aspect. Next at a block 138, the processor 152 decodes the multimedia data based on the parsed data.

It is to be recognized that depending on the embodiment, certain acts or events of any of the methods described herein can be performed in a different sequence, may be added, merged, or left out all together (e.g., not all described acts or events are necessary for the practice of the method). Moreover, in certain embodiments, acts or events may be performed concurrently, e.g., through multi-threaded processing, interrupt processing, or multiple processors, rather than sequentially.

Figure 3A:
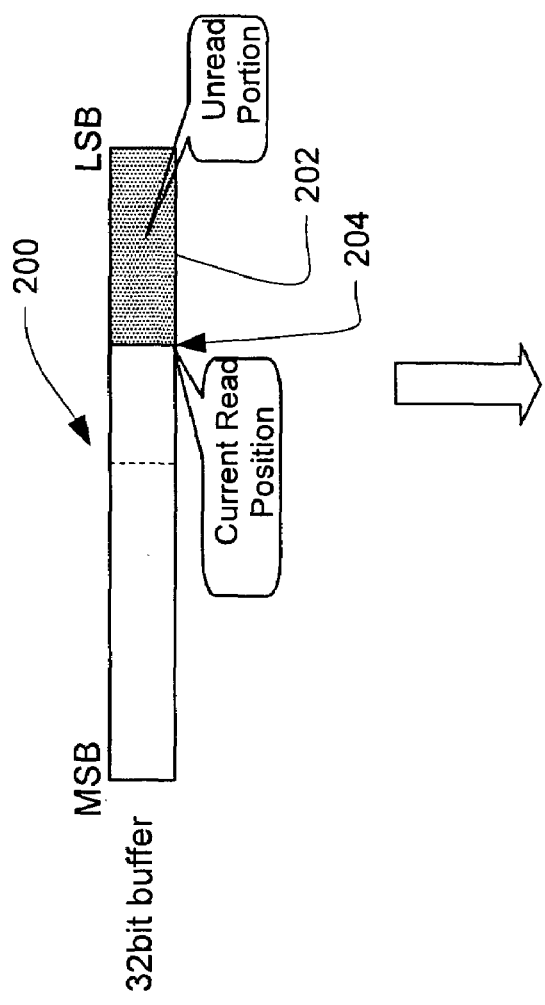
FIGS. 3A and 3B are schematic block diagrams graphically illustrating a method of processing a bitwise stream of encoded multimedia data in a memory buffer.
Figure 3B:
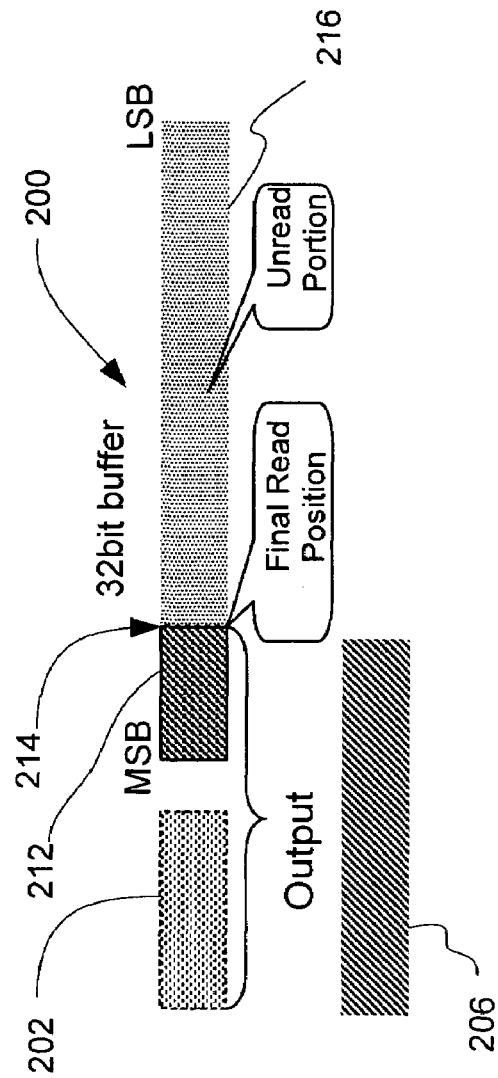

FIGS. 3A and 3B are schematic block diagrams graphically illustrating a method of processing a bitstream of encoded multimedia data in a buffer. FIG. 3A illustrates a buffer 200 that includes an unread portion 202 that is identified by a current read position indicator or pointer 204. In one example, the buffer 200 is a portion of the memory 154. In another example, the buffer 200 can be a register of the processor 152. The buffer 200 stores the portion of the data from the bitstream of multimedia data that is being decoded by the processor 152.

The bitstream of multimedia data is represented as a sequence of memory locations aligned according to the word size of the processor 152. In this example, a processor word is 32 bits. Accordingly, in such an example, the bitstream of multimedia data is stored in memory as one or more sequences of 4 byte words.

The buffer 200 provides working storage in which the word sized, e.g., 32 bit, portion of the multimedia data currently being decoded can be manipulated. As discussed above with reference to the block 136 of FIG. 2, decoding the multimedia data includes parsing and decoding fixed length and variable length codewords. If a fixed length codeword is decoded, a number of bits is read or copied from the buffer 200 into a second, output or working buffer, that is based on the length of the code, e.g., the number of bits copied is the number of bits in the codeword (if all codeword bits are available in the buffer 200). The position pointer 204 is then updated to reflect the number and position of unread bits in the buffer 200.

If the number of bits available in the buffer 200 is inadequate to provide all bits of a fixed length codeword, additional data is read from the bitstream of multimedia data. FIG. 3B illustrates the buffer 200 of FIG. 3A after additional bits have been read from the bitstream. In the illustrated example, the unread portion 202 of the buffer 200 (as illustrated in FIG. 3A) is loaded or copied to an output buffer 206. In addition, a 32 bit word of additional encoded multimedia data is read from the bitstream into the buffer 200, overwriting the prior data. In one example, the "endianess" of the encoded multimedia data may be reordered to match the preferred byte ordering of the processor. For example, if the bitstream of multimedia data is in big-endian format, the bytes in the buffer can be reordered in little-endian format, or vice versa.

It has been found empirically that reading a 32 bit word corresponding to the alignment of data in the bitstream substantially improves performance by 20-30%. A portion 212 of the new data corresponding to the remainder of the fixed length codeword is loaded or copied into the output buffer 206. The current read position is updated to the read position 214, leaving a portion 216 unread in the buffer and available for parsing out additional codewords.

Processing is more complicated for variable length codewords because the length of the code is not known until the codeword is decoded. Thus, if reading a variable length word, codeword data is copied to the output buffer 206, but also remains in the buffer to be processed later in the event that the decoded codeword is shorter than the requested size. If the decoded codeword is less then the amount of bits copied into the output buffer 206, those excess bits still need to be retrieved and processed from the bit stream. However, because bits requested for decoding of variable length codewords remain in the buffer 200, if insufficient bits remain in the buffer 200 for processing a variable length codeword, the buffer 200 lacks sufficient space to read a full 32 bits of aligned data from the bitstream.

In one example, variable length codewords are less than or equal to half the size of the buffer 200, e.g., 16 bits. In one such an example, if additional variable length codeword bits are requested, 16 bits of data are read from the stream. The unread portion of the buffer 202 (as illustrated in FIG. 3A) is then shifted 16 bits to the left (towards the most significant bit (MSB) of the buffer 200) and the 16 bits of new data from the stream are stored into the lower least significant bits (LSB) of the buffer 200.

Because fewer bits, e.g., 16 bits, are read into the buffer if a-variable length codeword is being processed, there is sufficient space to satisfy requests for 16 bits. However, the 16 bit transfer to the buffer from the bitstream throws the bitstream out of alignment for future reads. Accordingly, the contents of the buffer 200 can be adjusted to realign the bitstream after a variable length code is parsed from the multimedia data stream. In one embodiment, after the variable length code is decoded and its length determined, the current read position pointer of the buffer 200 is updated to reflect the number of bits of the decoded variable length code. The contents of the buffer 200 are then adjusted to realign the bitstream. For example, if the less than 16 bits remain in the buffer 200, an additional 16 bits of data from the bitstream may be shifted into the buffer 200 to realign the bitstream. If more than 16 bits remain in the buffer 200, 16 of the bits may be returned to the bitstream and the buffer 200 and its current read position pointer shifted accordingly.

Figure 4A:
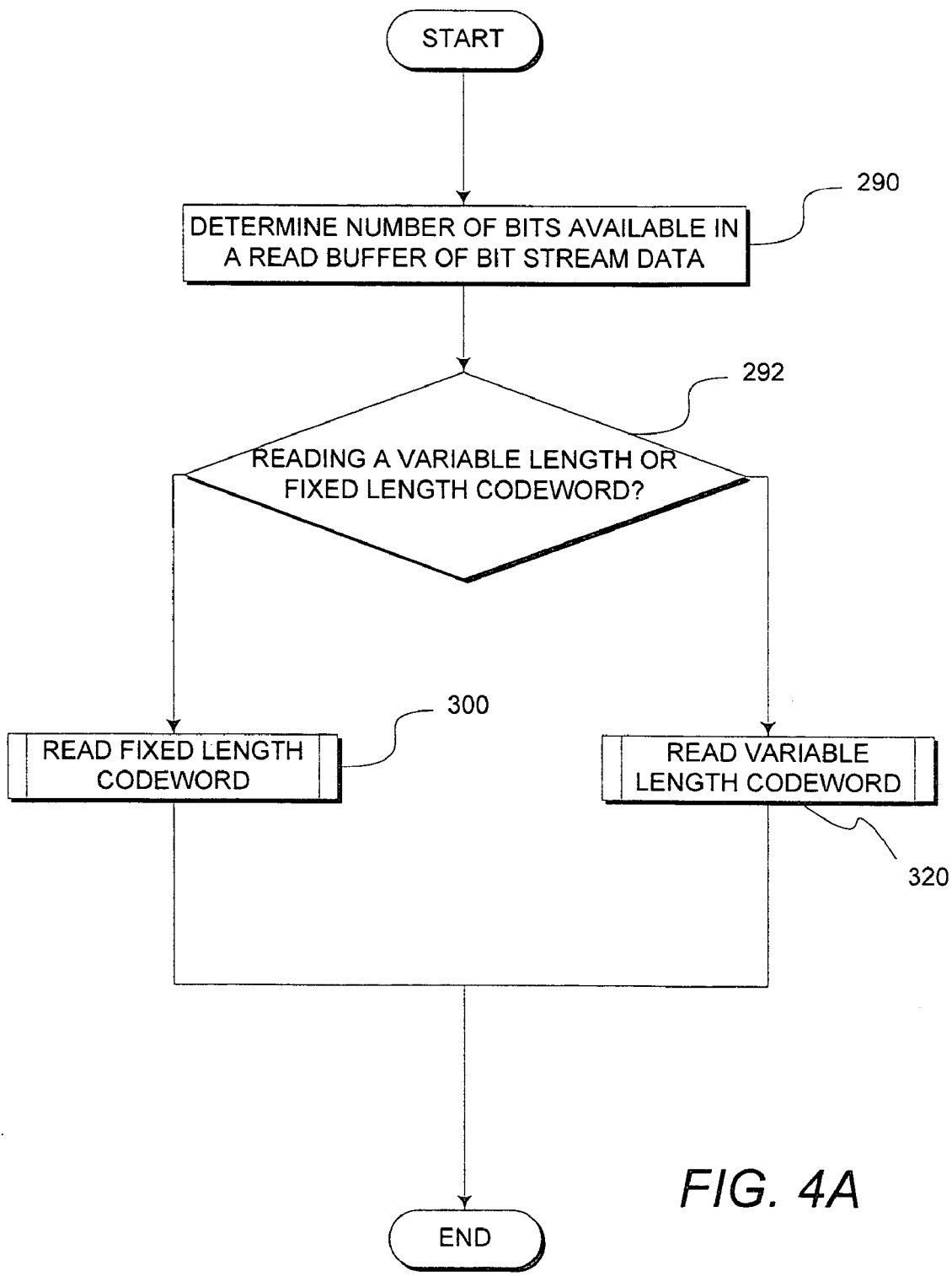
FIG. 4A is a flow chart illustrating one example of the method of processing a bitstream via buffers graphically illustrated in FIGS. 3A and 3B.

FIG. 4A is a flow chart illustrating one example of the method of processing a bitstream via buffers graphically illustrated in FIGS. 3A and 3B. The method begins at a block 290 in which the processor 152 determines the number of bits available in a read buffer of bit stream data, e.g., the buffer 200 illustrated in FIG. 3A. Next at a decision block 292, if reading a variable length codeword, the method proceeds to a block 300 in which a variable length code is read from the bitstream of multimedia data. Alternatively, at the block 292, if reading a fixed length code, the method proceeds to a block 330 in which a fixed length code is read from the bitstream. Certain embodiments of the methods associated with blocks 300 and 330 are discussed in more detail with reference to FIGS. 4B and 4C, respectively.

FIG. 4B is a flow chart illustrating one example of the method of processing a bitstream via buffers discussed with reference to FIGS. 3A and 3B. In particular, FIG. 4B illustrates portions of the method of the block 300 of FIG. 4A of processing of fixed length codes from an encoded multimedia bit stream according to one example. The method 300 begins at a block 302 in which the processor 152 requests a number of fixed length code bits from the encoded multimedia bit stream. In one example, the processor 152 executes a specified function or module configured to process or parse the bit stream. Moving to a block 304, the processor 152 determines the number of bits available in a read buffer of bit stream data, e.g., the buffer 200 illustrated in FIG. 3A. Next at a decision block 306, if the number of available bits is not less than the requested number of bits, the method 300 proceeds to a block 308 in which the processor 152 copies the requested number of bits into an output buffer, such as the output buffer 206 illustrated in FIG. 3B. Moving to a block 310, the processor 152 updates a buffer pointer or indicator to reflect that the requested number of bits have been removed from the read buffer and to therefore indicate the number of unprocessed bits in the read buffer 200. The method 300 proceeds from the block 310 to an end state wherein the process may be repeated for the next set of data in the multimedia data stream.

Returning to the decision block 306, where the number of available bits is less than the requested number of bits, the method 300 proceeds to the block 314 in which the available number of bits is loaded or copied into the output buffer 206 of FIG. 3B. Next at a block 316, the processor 152 performs an aligned load or read of data from the bit stream into the read buffer 200 of FIG. 3B. Performing the aligned read, e.g., of a 32 bit processor-word of data, has been found to substantially improve performance of parsing fixed length codes from the stream of multimedia data. In one example, the processor reads to data so as to maintain the read pointer (e.g., the start of unparsed data in the multimedia stream) aligned on a processor-word, e.g., 32 bit word boundary. In one example, the stream may also be aligned in one or more ways determined by the processor or computing system, e.g., based on system or processor alignments including those based on data addresses computations or bus size. For example, aligned data may include data that in which the start address of a 32-bit word is evenly divisible by 4.

Moving to a block 318, the processor 152 copies or loads the remainder of the requested bits from the read buffer (e.g., read buffer 200 of FIG. 3B) to the output buffer (e.g., the output buffer 206 of FIG. 3B). Next, the method 300 proceeds to the block 310, discussed above, and updates a buffer pointer or indicator (e.g., final read position 214 of FIG. 3B) to reflect that the requested number of bits have been removed from the buffer and to therefore indicate the number of unprocessed bits in the buffer 200. The method 300 proceeds from the block 310 to an end state wherein the process may be repeated for the next set of data in the multimedia data stream.

FIG. 4C is a flow chart further illustrating one example of a method 320 for processing a variable length codeword. The method 320 begins at a block 322 in which the processor 152 requests a number of variable length code bits from the encoded multimedia bit stream. In one example, the processor 152 executes a specified function or module configured to process or parse the bit stream. At a block 324, the processor 152 determines the number of bits available in the read buffer (e.g., the buffer 200 of FIG. 3B). Next at a decision block 326, if the processor 152 determines that sufficient bits are available to provide the requested number of variable length codeword bits, the method proceeds to a block 328 in which the requested number of bits is copied into the output buffer. If, at the decision block 326, the requested number of bits is not available, the method 320 proceeds to a block 330 in which 16 bits of data from the bit stream of multimedia data is read into the buffer, e.g., the buffer 200. In one example, 16 bits is an amount that results in the start (unread) position of the unprocessed multimedia stream data being unaligned for the processor 152). In other embodiments, a different number of bits that varies based on the processor or system architecture, which is less than the full buffer size (e.g., less than 32 bits) may be read.

Proceeding to the block 328, the requested number of bits is copied into the output buffer. Next at a block 340, the processor 152 decodes the variable length code using the requested bits. Decoding the variable length code includes determining the length of the variable length codeword (and, thus, the number of bits of data read from the stream that constituted the variable length codeword).

Moving to a block 342, the number of bits of data corresponding to the length of the variable length codeword are flushed from the read buffer 200. In one example, this includes updating the read pointer, e.g., to a read position such as illustrated by the read pointers 204 of FIG. 3A or 214 of FIG. 3B. Next at a block 344, if additional bits were read at the block 330 (which misaligned the multimedia data stream), the processor 152 corrects the misalignment of the buffer. For example, as illustrated in further detail in FIG. 4D, if the less than 16 bits remain in the buffer 200, an additional 16 bits of data from the bitstream may be shifted into the buffer 200 to realign the bitstream. If more than 16 bits remain in the buffer 200, 16 of the bits may be returned to the bitstream and the buffer 200 and its current read position pointer shifted accordingly.

FIG. 4D is a flow chart further illustrating the operation of block 344 of FIG. 4C in further detail. The checking and correcting 344 begins at a block 354 in which the processor 152 determines whether the read buffer 200 was misaligned at the block 330. If not, the function 344 ends. If the buffer was misaligned, the function proceeds to a block 356 in which the processor 152 determines whether the read buffer, e.g., buffer 200, has capacity to store an additional data from the multimedia stream in order to align the stream. For example, if less than 16 bits remain in the buffer 200, the 32 bit buffer 200 has capacity to store an additional 16 bits. Thus, if the buffer has capacity, the function 344 proceeds to a block 358 in which, for example, the processor 152 reads an additional 16 bits of data from the bitstream and shifts this data into the buffer 200 to realign the stream of multimedia data. If more than 16 bits remain in the buffer 200, 16 of the bits may be returned to the bitstream and the buffer 200 and its current read position pointer shifted accordingly. If at the decision block 356, the buffer 200 lacked an additional 16 bits of capacity, the function 344 proceeds to the block 360 in which 16 bits of data from the read buffer 200 are pushed back, e.g., loaded or copied to the beginning of the multimedia data stream, and shifted out of the buffer. Rather than actually moving data back to the stream, on non-aligned reads from the multimedia stream, the processor 152 may maintain separate aligned and unaligned data pointers to the read position of the multimedia stream to allow the "push back" of data to comprise merely setting the non-aligned pointer back to the aligned pointer position without the data being moved or removed from the multimedia data stream.

Now, turning to a method for an improved method of handling variable length coded data, the method is described below. FIG. 5 is a flow chart illustrating one aspect of a method 400 of processing multi media data elements encoded in a variable length code from a bitstream of encoded multi media data, such as that transmitted and received in the system illustrated in FIG. 1. The method 400 begins at a block 402 where the processor 152 reads a number of bits of variable length code data from a stream of multimedia data. This data includes at least a first portion of a variable length code. In one example, the number of bits is 8 and the table includes 256 entries. However, in other embodiments, a different number of bits may be read. Next at a block 404, the processor looks up an entry in a first decoding table based on the first set of bits read from the stream. If the variable length codeword being read is shorter than the number of bits in the first set of bits read, e.g., less than or equal to 8 bits, the read data will include the entire codeword in addition to portions of the next data item in the multimedia data stream and the decoding table entry can be used to decode the codeword. If the variable length code is longer than the number of bits of the first set of bits read, e.g., greater than 8 bits, the decoding table entry can be used to partially decode the codeword. Thus, moving to a decision block 406, the processor 152 determines whether the entry includes a reference to a second table for use in further decoding the codeword. If the table does not include a reference to a second table, the length of the codeword is less than or equal to the length of the read data. In that case, the method 400 may optionally proceed to a block 410 in which the variable length codeword is decoded based on decoding data in the entry of the first table. Thus, fewer number of bits are processed and a shorter lookup table can be considered to decode a variable length codeword, resulting in significant improvement in processing speed.

Returning to the block 406, if the entry in the first decoding table includes a reference to a second table, the method 400 may optionally proceed to a block 420 in which a second number of bits is read from the stream of multimedia data because the variable length codeword is longer than the first set of bits read, e.g., greater than 8 bits in length. Next at a block 422, the processor 152 identifies an entry in the second, referenced, decoding table based on the second number of bits read. In one example, the second number of bits read is 8 and the second referenced table includes 256 entries. Proceeding to the block 410, the processor decodes the variable length code using the decoding data in the entry of the second decoding table. If the second decoding table is used, decoding data from both the first and second decoding table entries can be used to decode the variable length code word. In other embodiments, additional lookup tables can be used, and thus if the length of a codeword exceeded the number of bits in the first two tables, the second table would reference a third, and so on.

In one example, if variable length codes are being read from the stream of multimedia data, the data remains in the stream until the codeword is decoded and its length determined. Thus, next at a block 412, the processor 412 flushed a number of bits specified by the decoding table entry (or entries) from the stream of multimedia data. In one example, the method 400 includes use of the method 300 of parsing the bitstream that is discussed with reference to FIGS. 4A-4D to read the variable length code data from the bit stream.

Embodiments of the method 400 may be applied to decoding multimedia data elements such luma or chroma data in a video data stream. Embodiments may be used to decode multimedia data elements including data elements in a stream comprising one or more of audio, video, text, metadata, images, or any other any suitable type of data encoded in a variable length code.

FIG. 6 is a schematic block diagram illustrating one example of a data structure such as used in the method 400. In one example, a first decoding table 442 includes numerous entries 444. The table 442 can be an array of entries that can be accessed as a lookup table according to any suitable method, including those known in the art. Each entry 444 can store one or more of data for decoding a codeword, data indicating the length of the codeword, or data pointing or referencing a second level decoding table 446. The data for decoding a codeword may include a pointer or reference to another data structure (not shown) that includes further data for use in decoding a codeword. Depending on the variable length code, the table 442 may point or reference one or more second level decoding tables 446. Depending on the variable length code, the second level decoding table 446 may include a further reference to a third level decoding table, which in turn is structured similarly to a second level table 446. Each second level table includes entries 448, which may include one or more of data for decoding a codeword, data indicating the length of the codeword, or a pointer or reference for accessing a third level table. Thus, as described above with reference to FIG. 5, the method 400 looks up a fixed number of codeword bits in the first level decoding table 442. If the codeword is less than the number of codeword bits, the codeword is decoded using data in the first level table 442. If the codeword is longer, as indicated by the entry 444 in the first level table, additional decoding data from the second level decoding table 446 (and possibly third or fourth, etc. level tables) is looked up and used to decode the longer codeword.

FIG. 7 is a flow chart illustrating one example of an improved method 500 of processing variable length codes from a bitstream of encoded multimedia data, such as that transmitted and received in the system illustrated in FIG. 1. In this example, the codes include a prefix and a suffix. The method 500 begins at a block 502 in which the processor 152 determines whether the length of the suffix equals zero. If the length of the suffix equals zero, the method 500 proceeds to a block 504 in which the processor 152 determines whether the prefix is less than or equal to a predetermined value, e.g., 14. If at the block 504, the prefix is less than or equal to 14, the method 500 ends and the process may be repeated for the next set of data in the multimedia data stream. If at the block 504, the prefix is determined to be not less than 14, the method 500 proceeds to a decision block 506 in which the prefix is compared to the predetermined value, e.g., 14. If the prefix equals this value, the method 500 proceeds to a block 510 in which 4 bits are read. If the prefix does not equal the predetermined value of 14, the method 500 proceeds to a block 512 in which 12 bits are read. Next at a block 514, a level code associated with processing of the variable length code is incremented by 15 and wherein the process may be repeated for the next set of data in the multimedia data stream.

Returning to the block 502, if the suffix length does not equal zero, the method 500 proceeds to a decision block 520 in which the processor 152 determines whether the prefix is less than or equal to a predetermined value, e.g., 14. If the prefix is less than or equal to 14, the processor 152 reads the suffix bits, e.g., the number of bits specified by the suffix length. If the prefix is greater than 14, the method 500 moves to a block 524, in which the processor 152 reads 12 bits from the multimedia data stream. The process may be repeated for the next set of data in the multimedia data stream.

Figure 8:
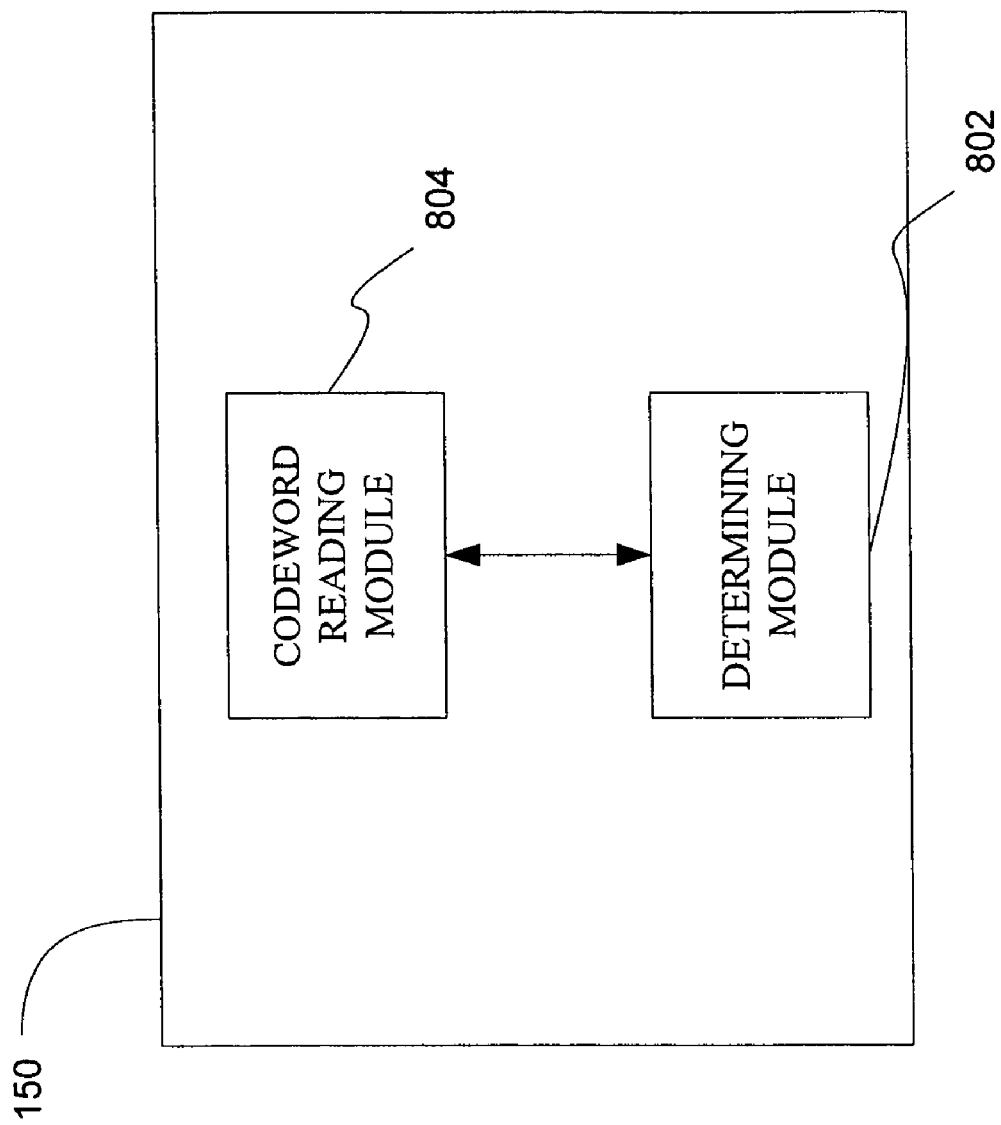
FIG. 8 illustrates an example of an apparatus for processing received encoded multimedia data in accordance with the method illustrated in FIGS. 4A-4D.

In one example, an apparatus for processing received encoded multimedia data may comprises a means for determining a number of bits available in a first buffer of encoded multimedia data from a received bitstream. The apparatus further comprises means for reading a codeword. If reading a fixed length codeword, the means for reading reads processor-aligned data from the bitstream into the first buffer. The fixed codeword comprises the determined available bits and bits associated with a portion of the processor-aligned data. If reading a variable length codeword, the means for reading reads processor-unaligned data from the bitstream into the first buffer. The variable length codeword comprises at least some of the available bits. FIG. 8 illustrates an example of the decoder 150 for processing received encoded multimedia data. The means for determining may comprise a determining module 802. The means for reading a codeword may comprise a codeword reading module 804. The example of the decoder 150 illustrated in FIG. 8 may be configured to perform the method discussed with reference to FIGS. 4A-4D.

Figure 9:
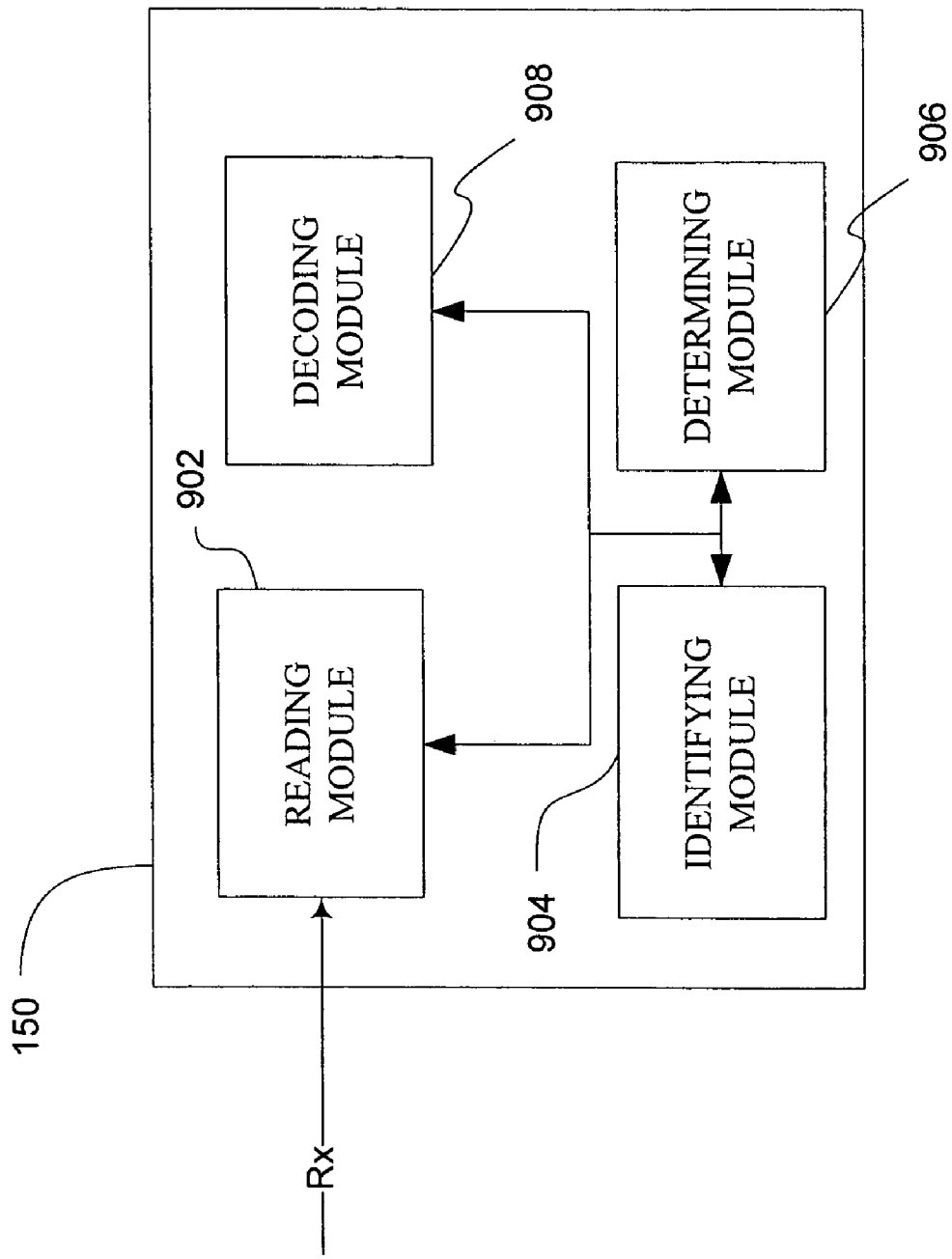
FIG. 9 illustrates another example of an apparatus for processing received encoded multimedia data in accordance with the method illustrated in FIGS. 5.

In one example, an apparatus for decoding a variable length code in a stream of multimedia data comprises means for reading a first number of bits in a portion of a the stream of multimedia data. The apparatus further comprises means for identifying first decoding data in a first data structure based at least in part on the first number of bits. The apparatus further comprises means for determining whether the first decoding data is indicative of a second data structure comprising decoding data. The apparatus further includes means for decoding multimedia data based at least in part on one of the first and second decoding data. FIG. 9 illustrates an example of the decoder 150 for decoding a variable length code in a stream of multimedia data. The means for reading may comprise a reading module 902. The means for identifying may comprise an identifying module 904. The means for determining may comprise a determining module 906. The means for decoding may comprise a decoding module 908. The example of the decoder 150 illustrated in FIG. 9 may be configured to perform the method discussed with reference to FIG. 5.

Figure 10:
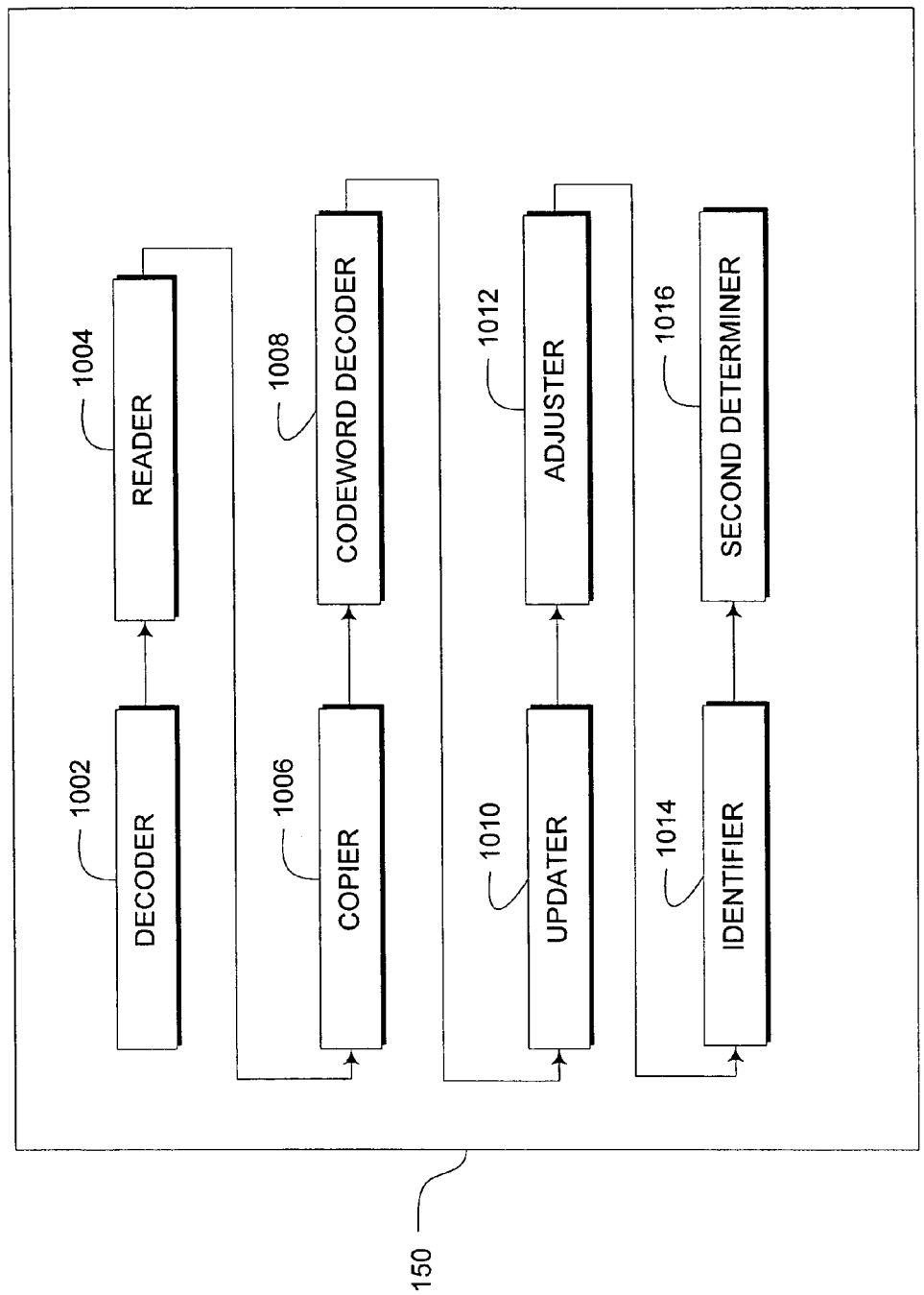
FIG. 10 illustrates another example of an apparatus for processing received encoded multimedia data in accordance with the method illustrated in FIGS. 4A-4D.

FIG. 10 illustrates another example of the decoder 150. The example of the decoder 150 illustrated in FIG. 10 may be configured to perform the method discussed with reference to FIGS. 4A-4D. The example of the decoder 150 illustrated in FIG. 10 comprises a determiner 1002 configured to determine a number of bits available in a first buffer of encoded multimedia data from a received bitstream. The decoder 150 further comprises a reader 1004 configured to, if reading a fixed length codeword, read processor-aligned data from the bitstream into the first buffer. The fixed length codeword comprises the determined available bits and bits associated with a portion of the processor-aligned data. The reader 1004 is further configured to, if reading a variable length codeword, read processor-unaligned data from the bitstream into the first buffer. The variable length codeword comprises at least some of the available bits. The decoder 150 may further comprise a copier 1006 configured to, if reading the fixed length codeword, copy the determined available bits into a second buffer prior to reading the processor-aligned data and then copying bits associated with the portion of the processor-aligned data from the first buffer to the second buffer. The decoder 150 may further include a codeword decoder 1008 that is configured to decode the variable length codeword. The decoder 150 may further comprise an updater 1010 configured to update the number of bits available in the first buffer based at least in part on the length of the decoded variable length codeword and an adjuster 1012 configured to adjust the content of the first buffer to align data in the bitstream. In one aspect, the decoder 150 further includes an identifier 1014 configured to identify first decoding data in a first data structure based at least in part on data in the first buffer and a second determiner 1016 configured to determine whether the first decoding data is indicative of a second data structure comprising decoding data.

Figure 11:
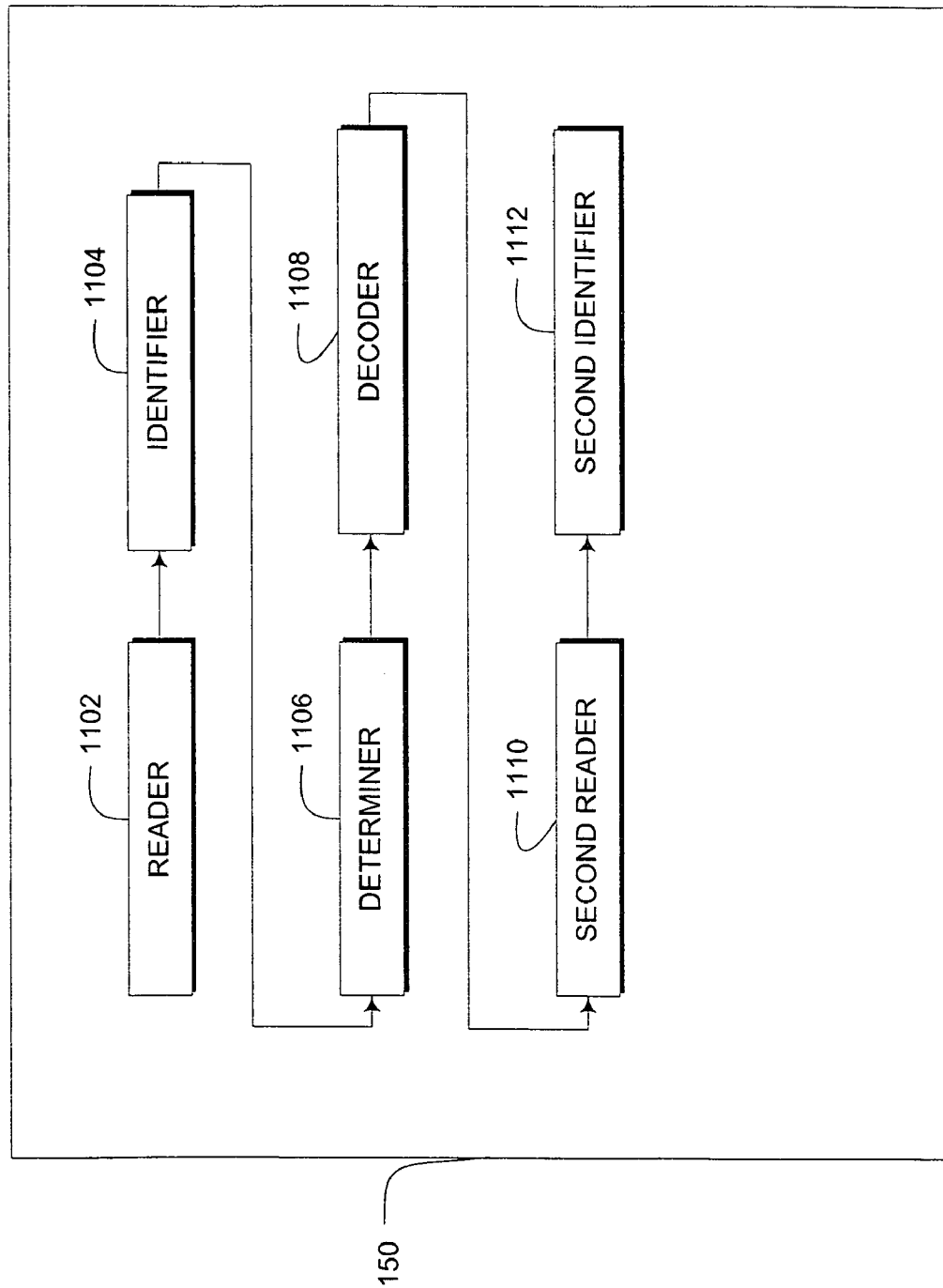
FIG. 11 illustrates another example of an apparatus for processing received encoded multimedia data in accordance with the method illustrated in FIGS. 5.

FIG. 11 illustrates another example of the decoder 150. The example of the decoder 150 illustrated in FIG. 11 may be configured to perform the method discussed with reference to FIG. 5. The example of the decoder 150 illustrated in FIG. 11 comprises a reader 1102 configured to read a first number of bits in a portion of the stream of multimedia data. The decoder 150 further comprises an identifier 1104 configured to identify first decoding data in a first data structure based at least in part on the first number of bits. The decoder 150 further comprises a determiner 1106 configured to determine whether the first decoding data is indicative of a second data structure comprising decoding data. The decoder 150 further comprises a decoder 1108 configured to decode multimedia data based at least in part on one of the first and second decoding data. In one aspect, the decoder 150 further comprises a second reader 1110 configured read a second number of bits in a second portion of the stream of multimedia data and a second identifier 1112 configured to identify the second decoding data in a second data structure based at least in part on the second portion of the multimedia data.

Those of skill will recognize that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed by processor 152 or with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Moreover, it should be noted that the decoder device 150 of FIGS. 1 and 8-10 are simplified examples. Accordingly, additional elements may be added without affecting the operation of the decoder as described above. Also, one or a combination of elements of decoder device 150 of FIGS. 1, 8, 9, 10 and/or 11 may be combined and/or rearranged without affecting the operation of the decoder as described above.

Therefore, the previous description of the disclosed embodiments is provided to enable any person skilled in the art to make or use the present invention. Various modifications to these embodiments will be readily apparent to those skilled in the art, and the generic principles defined herein may be applied to other embodiments. Thus, the present invention is not intended to be limited to the embodiments shown herein but is to be accorded the widest scope consistent with the principles and novel features disclosed herein.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others. The scope of the invention is indicated by the appended claims rather than by the foregoing description. All changes which come within the meaning and range of equivalency of the claims are to be embraced within their scope.

What is claimed is:

1. A method of processing received encoded multimedia data, the method comprising:
    determining a number of bits available in a first buffer of encoded multimedia data from a received bitstream;
    if reading a fixed length codeword, reading processor-aligned data from the bitstream into the first buffer, wherein the fixed length codeword comprises the determined available bits and bits associated with a portion of the processor-aligned data; and
    if reading a variable length codeword, reading processor-unaligned data from the bitstream into the first buffer, wherein the variable length codeword comprises at least some of the available bits.

2. The method of claim 1, further comprising:
    if reading the fixed length codeword, copying the determined available bits into a second buffer prior to reading the processor-aligned data and then copying bits associated with the portion of the processor-aligned data from the first buffer to the second buffer.

3. The method of claim 1, wherein reading processor unaligned data comprises reading 16 bits and reading processor-aligned data comprises reading 32 bits.

4. The method of claim 1, further comprising:
    decoding the variable length codeword;
    updating the number of bits available in the first buffer based at least in part on the length of the decoded variable length codeword; and
    adjusting the content of the first buffer to align data in the bitstream.

5. The method of claim 4, wherein decoding the variable length codeword comprises:
    identifying first decoding data in a first data structure based at least in part on data in the first buffer; and
    determining whether the first decoding data is indicative of a second data structure comprising decoding data.

6. The method of claim 4, wherein adjusting the content of the first buffer to align data in the bitstream comprises reading processor-unaligned data from the bitstream.

7. The method of claim 4, wherein adjusting the content of the first buffer to align data in the bitstream comprises returning the processor-unaligned data to the bitstream.

8. The method of claim 1, wherein reading processor-aligned data from the bitstream of encoded multimedia data comprises reordering bytes of data within a word.

9. The method of claim 8, wherein reordering bytes of data within a word comprises reordering data from a big-endian format into a little-endian format.

10. A computer readable medium for embodying a method for processing multimedia data, the method comprising:
    determining a number of bits available in a first buffer of encoded multimedia data from a received bitstream;
    if reading a fixed length codeword, reading processor-aligned data from the bitstream into the first buffer, wherein the fixed length codeword comprises the determined available bits and bits associated with a portion of the processor-aligned data; and
    if reading a variable length codeword, reading processor-unaligned data from the bitstream into the first buffer, wherein the variable length codeword comprises at least some of the available bits.

11. The computer readable medium of claim 10, the method further comprising:
  decoding the variable length codeword;
  updating the number of bits available in the first buffer based at least in part on the length of the decoded variable length codeword; and
  adjusting the content of the first buffer to align data in the bitstream.

12. The computer readable medium of claim 11, wherein decoding the variable length codeword comprises:
  identifying first decoding data in a first data structure based at least in part on data in the first buffer; and
  determining whether the first decoding data is indicative of a second data structure comprising decoding data.

13. An apparatus for processing received encoded multimedia data, the apparatus comprising:
  means for determining a number of bits available in a first buffer of encoded multimedia data from a received bitstream; and
  means for reading a codeword, wherein if reading a fixed length codeword, said means for reading reads processor-aligned data from the bitstream into the first buffer, wherein the fixed codeword comprises the determined available bits and bits associated with a portion of the processor-aligned data, and wherein if reading a variable length codeword, said means for reading reads processor-unaligned data from the bitstream into the first buffer, wherein the variable length codeword comprises at least some of the available bits.

14. The apparatus of claim 13, wherein said means for reading further comprising means for copying the determined available bits into a second buffer prior to reading the processor-aligned data and then copying bits associated with the portion of the processor-aligned data from the first buffer to the second buffer.

15. The apparatus of claim 13, wherein said means for reading processor unaligned data comprises means for reading 16 bits and reading processor-aligned data comprises reading 32 bits.

16. The apparatus of claim 13, further comprising:
  means for decoding the variable length codeword;
  means for updating the number of bits available in the first buffer based at least in part on the length of the decoded variable length codeword; and
  means for adjusting the content of the first buffer to align data in the bitstream.

17. The apparatus of claim 16, wherein said means for decoding the variable length codeword comprises:
  means for identifying first decoding data in a first data structure based at least in part on data in the first buffer; and
  means for determining whether the first decoding data is indicative of a second data structure comprising decoding data.

18. The apparatus of claim 16, wherein said means for adjusting the content of the first buffer to align data in the bitstream comprises means for reading processor-unaligned data from the bitstream.

19. The apparatus of claim 16, wherein said means for adjusting the content of the first buffer to align data in the bitstream comprises means for returning the processor-unaligned data to the bitstream.

20. An apparatus for processing multimedia data, comprising:
  a determiner configured to determine a number of bits available in a first buffer of encoded multimedia data from a received bitstream; and
  a reader configured to, if reading a fixed length codeword, read processor-aligned data from the bitstream into the first buffer, wherein the fixed length codeword comprises the determined available bits and bits associated with a portion of the processor-aligned data, and, if reading a variable length codeword, read processor-unaligned data from the bitstream into the first buffer, wherein the variable length codeword comprises at least some of the available bits.

21. The apparatus of claim 20, further comprising:
  a copier configured to, if reading the fixed length codeword, copy the determined available bits into a second buffer prior to reading the processor-aligned data and then copying bits associated with the portion of the processor-aligned data from the first buffer to the second buffer.

22. The apparatus of claim 20, wherein the reader is configured to read processor unaligned data comprising 16 bits of data and the reader is configured to read processor-aligned data comprising 32 bits of data.

23. The apparatus of claim 20, further comprising:
  a codeword decoder configured to decode the variable length codeword;
  an updater configured to update the number of bits available in the first buffer based at least in part on the length of the decoded variable length codeword; and
  an adjuster configured to adjust the content of the first buffer to align data in the bitstream.

24. The apparatus of claim 20, further comprising:
  an identifier configured to identify first decoding data in a first data structure based at least in part on data in the first buffer; and
  a second determiner configured to determine whether the first decoding data is indicative of a second data structure comprising decoding data.

25. The apparatus of claim 24, wherein the adjuster is configured to adjust the content of the first buffer to align data in the bitstream by at least in part reading processor-unaligned data from the bitstream.

26. The apparatus of claim 24, wherein as part of adjusting the content of the first buffer to align data in the bitstream, the adjuster is further configure to return the processor-unaligned data to the bitstream.

27. The apparatus of claim 20, wherein as part of reading processor-aligned data from the bitstream of encoded multimedia data, the reader is further configured to reorder bytes of data within a word.

28. A processor for processing multimedia data, the processor being configured to:
  determine a number of bits available in a first buffer of encoded multimedia data from a received bitstream;
  if reading a fixed length codeword, read processor-aligned data from the bitstream into the first buffer, wherein the fixed length codeword comprises the determined available bits and bits associated with a portion of the processor-aligned data; and
  if reading a variable length codeword, read processor-unaligned data from the bitstream into the first buffer, wherein the variable length codeword comprises at least some of the available bits.

29. The processor of claim 28, wherein said processor is further configured to, if reading the fixed length codeword, copy the determined available bits into a second buffer prior to reading the processor-aligned data and then copying bits associated with the portion of the processor-aligned data from the first buffer to the second buffer.

30. The processor of claim 28, wherein the processor is further configured to:
- identify first decoding data in a first data structure based at least in part on data in the first buffer; and
- determine whether the first decoding data is indicative of a second data structure comprising decoding data.

31. The processor of claim 30, wherein the processor is configured to adjust the content of the first buffer to align data in the bitstream by at least in part reading processor-unaligned data from the bitstream.

32. The processor of claim 30, wherein as part of adjusting the content of the first buffer to align data in the bitstream, the processor is further configured to return the processor-unaligned data to the bitstream.

33. The processor of claim 28, wherein as part of reading processor-aligned data from the bitstream of encoded multimedia data, the processor is further configured to reorder bytes of data within a word.

* * * * *